United States Patent
Shibata et al.

(10) Patent No.: US 7,129,521 B2
(45) Date of Patent: Oct. 31, 2006

(54) SEMICONDUCTOR DEVICE AND MANUFACTURE METHOD THEREOF

(75) Inventors: Hiroshi Shibata, Yamagata (JP); Osamu Nakamura, Kanagawa (JP); Shunichi Naka, Osaka (JP); Tohru Ueda, Hiroshima (JP)

(73) Assignees: Semiconductor Energy Laboratory Co., Ltd., Kanagawa-ken (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/406,591

(22) Filed: Apr. 4, 2003

(65) Prior Publication Data
US 2005/0258421 A1 Nov. 24, 2005

(30) Foreign Application Priority Data
Apr. 5, 2002 (JP) .............................. 2002-103573

(51) Int. Cl.
*H01L 29/04* (2006.01)
*H01L 29/15* (2006.01)

(52) U.S. Cl. ............................. 257/59; 257/72; 257/66; 257/687; 257/613; 257/614; 257/615; 257/616; 257/617; 257/E29.273

(58) Field of Classification Search .................. 257/59, 257/72, 66, 687, 613–617, E29.273; 438/143, 438/487, 471, 511, 797
See application file for complete search history.

(56) References Cited

U.S. PATENT DOCUMENTS

| | | | |
|---|---|---|---|
| 5,508,554 A * | 4/1996 | Takatani et al. ............ 257/617 |
| 5,569,936 A * | 10/1996 | Zhang et al. .................. 257/66 |
| 5,578,865 A * | 11/1996 | Vu et al. ...................... 257/611 |
| 6,023,088 A * | 2/2000 | Son ............................. 257/347 |
| 6,197,656 B1 | 3/2001 | Adkisson et al. |
| 6,333,532 B1 | 12/2001 | Davari et al. |
| 6,335,540 B1 | 1/2002 | Zhang |
| 6,337,500 B1 * | 1/2002 | Nakaoka et al. ............ 257/349 |
| 6,352,912 B1 * | 3/2002 | Brown et al. ............... 438/528 |
| 6,353,245 B1 | 3/2002 | Unnikrishnan |
| 6,429,097 B1 | 8/2002 | Voutsas et al. |
| 6,444,534 B1 * | 9/2002 | Maszara ..................... 438/311 |
| 6,468,841 B1 * | 10/2002 | Muramatsu et al. ........ 438/150 |
| 6,528,851 B1 * | 3/2003 | Yu .............................. 257/347 |
| 6,713,323 B1 | 3/2004 | Yamazaki et al. |
| 6,812,081 B1 | 11/2004 | Yamazaki et al. |
| 6,858,480 B1 | 2/2005 | Nakamura et al. |
| 2002/0084747 A1 * | 7/2002 | Fujieda et al. .............. 313/506 |
| 2002/0125480 A1 | 9/2002 | Nakamura et al. |

* cited by examiner

*Primary Examiner*—Jerome Jackson
*Assistant Examiner*—Joseph Nguyen
(74) *Attorney, Agent, or Firm*—Eric J. Robinson; Robinson Intellectual Property Law Office, P.C.

(57) ABSTRACT

The problem is to provide a technology to reduce a light leakage current in order to obtain a good display. One kind or plurality kinds of elements chosen from argon, germanium, silicon, helium, neon, krypton, and xenon are implanted in a crystalline semiconductor layer, to distribute crystal defects due to the aforementioned element implantation by uniform and suitable density in the semiconductor film, making recombination centers of carriers, to thereby suppress alight sensitivity without spoiling a high degree of carrier movement included in a crystalline semiconductor layer.

12 Claims, 13 Drawing Sheets

FORMATION OF BASE-MATERIAL INSULATING FILM/
FORMATION OF AMORPHOUS SILICON FILM

ADDITION OF METALLIC ELEMENT

HEAT-TREATMENT

DEFECT FORMATION (SILICON, ARGON, GERMANIUM ADDITION)

FORMATION OF BASE-MATERIAL INSULATING FILM/
FORMATION OF AMORPHOUS SILICON FILM

ADDITION OF METALLIC ELEMENT

HEAT-TREATMENT

DEFECT FORMATION (ADDITION OF SILICON, ARGON, GERMANIUM)

FORMATION OF MASK INSULATING FILM/ ADDITION OF IMPURITY ELEMENT HAVING GETTERING ACTION

HEAT-TREATMENT (GETTERING)

FORMATION OF BARRIER LAYER/FORMATION OF GETTERING REGION (SEMICONDUCTOR FILM)

HEAT-TREATMENT (GETTERING)

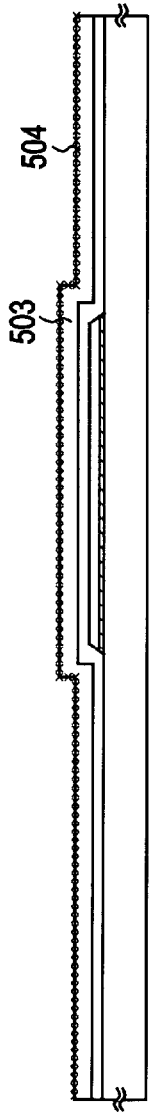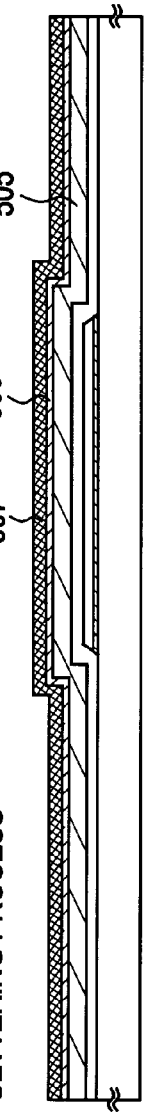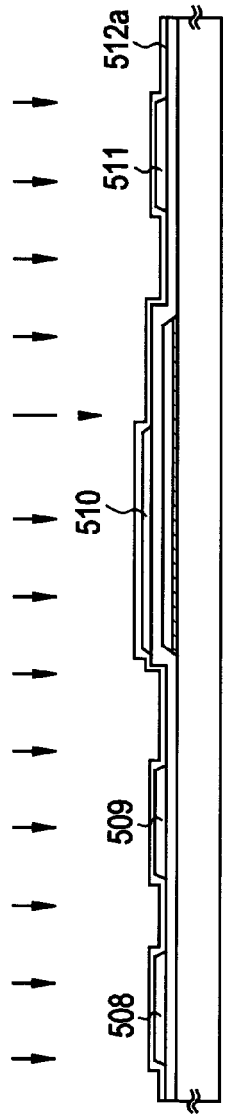
FIG. 7A FORMATION OF LOWER LIGHT SHIELDING FILM (GATE LINE)/FORMATION OF FIRST INSULATING FILM
FIG. 7B FORMATION OF AMORPHOUS SILICON FILM/ADDITION OF CATALYST ELEMENT/HEAT-TREATMENT
FIG. 7C GETTERING PROCESS
FIG. 7D FORMATION OF SEMICONDUCTOR LAYER/FORMATION OF GATE INSULATING (FIRST LAYER)/FORMATION OF DEFECTS (ADDITION (DOPING) OF Ar, Si, Ge)

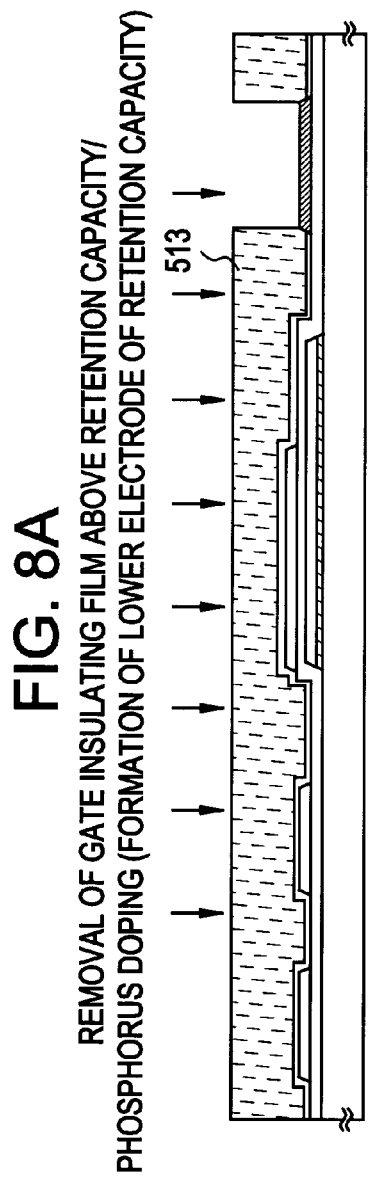
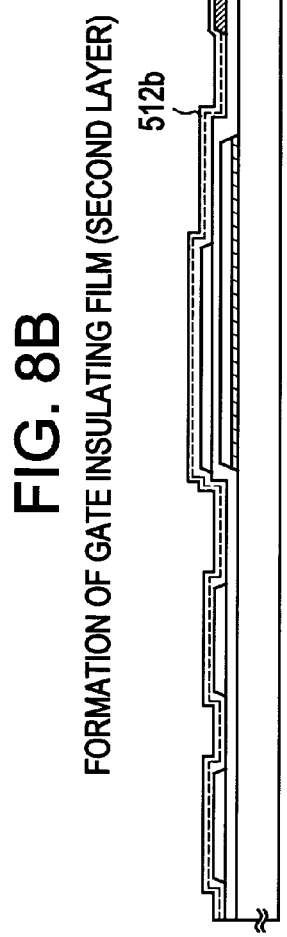
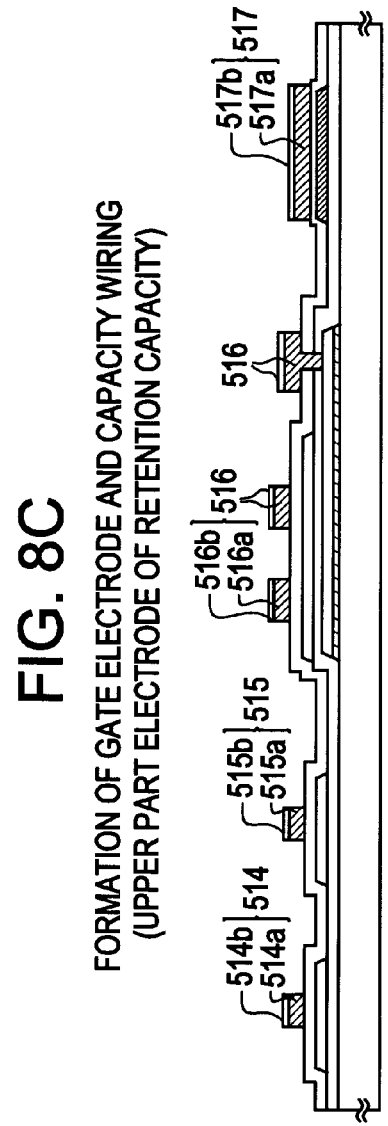

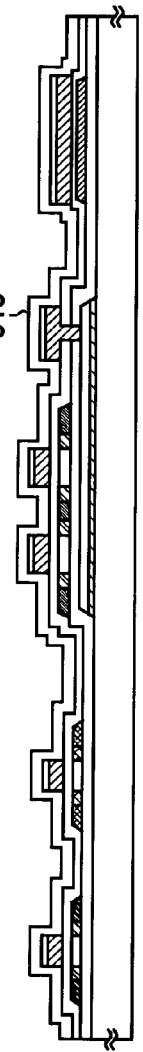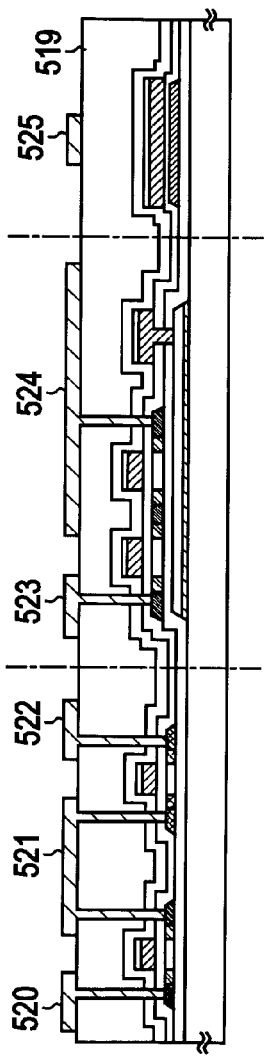

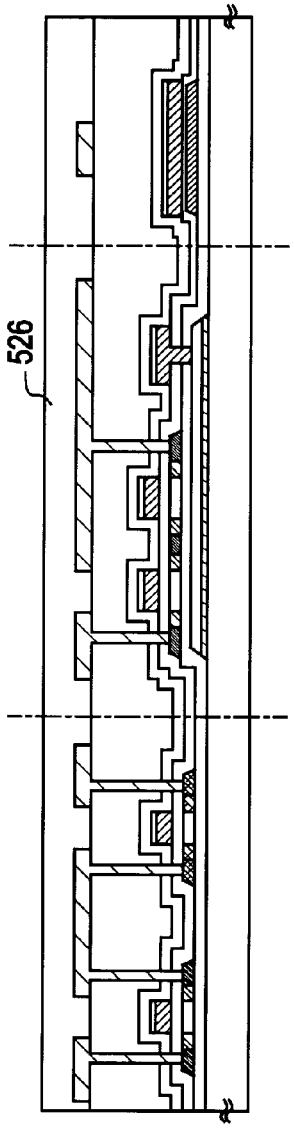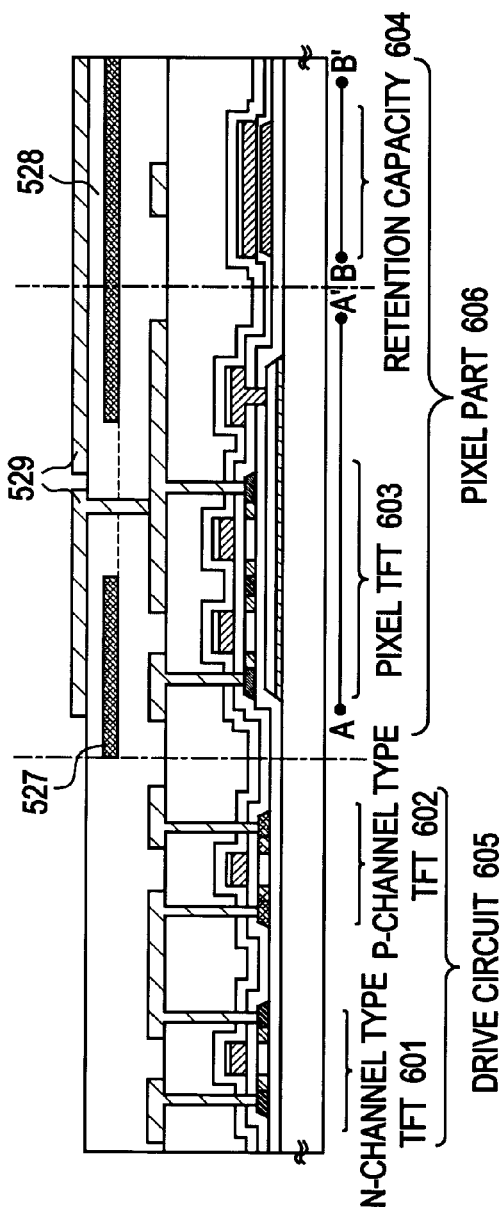

PROJECTION DEVICE (THREE PLATE TYPE)

LIGHT SOURCE OPTICAL SYSTEM

SEMICONDUCTOR DEVICE AND MANUFACTURE METHOD THEREOF

BACKGROUND OF THE INVENTION

1. Field of the Invention

This invention relates to a technology to fabricate a crystalline silicon film, and relates to a semiconductor device including the crystalline silicon film obtained with the application of this invention, and its manufacture technology.

2. Related Art

A semiconductor device using a crystalline silicon film for a semiconductor layer including at least a channel formation region, a source region, and a drain region formed thereon, and typically an active matrix type display device wherein a circuit is formed by combining a Thin Film Transistor: TFT to be built in and used as a drive circuit, has been widely used.

In a crystalline silicon film, a high field effect mobility (high-speed movement of a carrier) is obtained as compared with a field effect mobility of TFT (0.5 to 1 $cm^2/Vs$) which uses the conventional amorphous silicon film. For this reason, the crystalline silicon film is considered as not only suitable for a display device which is further required for high definition, but also suitable for integration of a drive circuit. Accordingly, technical development for obtaining a crystalline silicon film with good crystallizability is further pursued.

A liquid crystal display device is mentioned as typical equipment using TFT which uses a crystalline silicon film as a circuit element. The market of the liquid crystal display device is expanding rapidly, making use of the advantages such as a low power consumption and space saving, to find the way into a display part of electrical appliances such as a liquid crystal television or a view finder of a video camera and an optical system of an LCD projector.

In recent years, the LCD projector is becoming widely used in ordinary homes also, and responding to user's demand for a high luminance, intense light such as a xenon arc lamp for example is used as a light source. However, when the light from this intense light source carried out incidence onto a semiconductor layer, a carrier was induced to flow in silicon, to thereby raise a problem of leakage current being generated by light.

In case of a silicon film with good crystallizability such as a grain boundary, especially a continuous grain boundary (with small energy barriers of the grain boundary part and few crystal defects in a grain), lattice matching of the crystal grain boundary is good and carrier life is long. Therefore, the lifetime of an electron/hole pairs excited by light also tends to serve as leakage current (also referred to as light leakage current) of TFT as it is. The light leakage current, causing a contrast fall, needs to be reduced.

Therefore, as a measure against the light leakage current, technical development to form a light shielding film on TFT is generally pursued for interrupting the light before carrying out incidence onto the semiconductor layer. However, light intensity of a lamp increased every year responding to the demand for a high luminance. Consequently, even stray light generated by diffraction or abundant reflection inside a semiconductor device is becoming the intensity of not disregarded as an optical leakage factor. The light shielding film needs to be formed in order to shield even this stray light, involving the problem of increase in large manufacture cost.

In view of the above problem, object of this invention is to achieve a semiconductor device capable of reducing the light leakage current of TFT and performing a good display by suppressing the optical sensitivity of the semiconductor film itself.

SUMMARY OF THE INVENTION

In this invention, one kind or plurality kinds of elements chosen from argon, germanium, silicon, helium, neon, krypton, and xenon are implanted in a crystalline semiconductor film to distribute crystal defects due to the aforementioned element implantation by uniform density in the semiconductor film.

In this invention, a semiconductor layer contains the elements chosen from silicon, argon, germanium, helium, neon, krypton, and xenon, with a concentration of $1\times10^{16}$–$5\times10^{18}$/cm$^3$.

Also, the semiconductor layer contains the elements chosen from silicon, argon, germanium, helium, neon, krypton, and xenon, with a concentration of $1\times10^{16}$–$5\times10^{18}$/cm$^3$. And crystal defects are formed in the semiconductor layer by doping the aforementioned elements.

Also, this invention includes the processes of forming an amorphous semiconductor film, forming a crystalline semiconductor film by doping metallic elements over the amorphous semiconductor film followed by heat-treatment, and doping the elements chosen from silicon, argon, germanium, helium, neon, krypton, and xenon over the crystalline semiconductor film.

Moreover, defects are formed effectively in a semiconductor layer by doping the elements chosen from silicon, argon, germanium, helium, neon, krypton, and xenon with a concentration of $1\times10^{16}$–$5\times10^{18}$/cm$^3$ (implantation). The formed defects, serving as the recombination centers in carriers, can capture the carriers induced by the incidence of the intense light from a light source onto a semiconductor layer, to allow the light leakage current to be reduced.

Here, density of the defects introduced into a semiconductor layer is important. Object of this invention is to use these crystalline defects as a trap site of photo-excited carriers. However, excessively high-density crystal defects spoil the high degree of carrier movement itself, involving a fall of TFT performance. On the other hand, excessively low-density crystal defects cause a reduction in the trap sites of a photo-excited carrier itself, involving a decrease in effectiveness to reduce the optical leakage. It becomes possible to suppress light leakage of TFT, with the TFT performance maintained, by setting density of doping element so that suitable crystal defective density may be obtained.

Also by applying the semiconductor film of this invention to a pixel TFT of a transmit type display device, even when the optical incidence onto the pixel TFT is not stopped to some extent, the light leakage current of the pixel TFT can be reduced. Therefore, inputted signal electric charge can be maintained, uneven brightness and luminance dispersion can be reduced, and good contrast can be obtained.

BRIEF DESCRIPTION OF THE DRAWINGS

FIGS. 7A to 7D are views showing a process for manufacturing a display device using this invention. (1)

FIGS. 8A to 8c are views showing a process for manufacturing a display device using this invention. (2)

FIGS. 9A to 9C are views showing a process for manufacturing a display device using this invention. (3)

FIGS. 10A and 10B are views showing a process for manufacturing a display device using this invention. (4)

PREFERRED EMBODIMENTS OF THE INVENTION

Embodiment 1

Figure 1A:
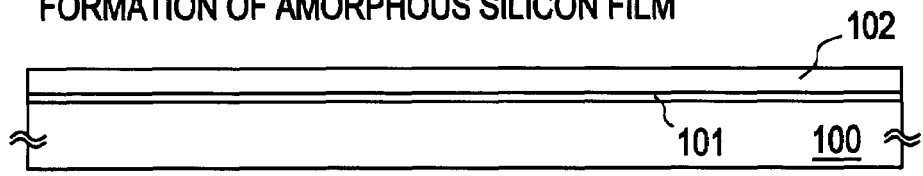
FIGS. 1A to 1D are views showing an example of a crystallization method using this invention. (Embodiment 1)
Figure 1B:
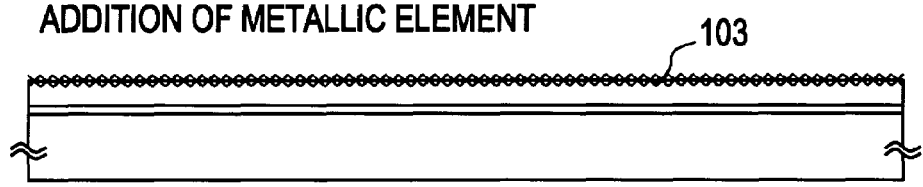
Figure 1C:
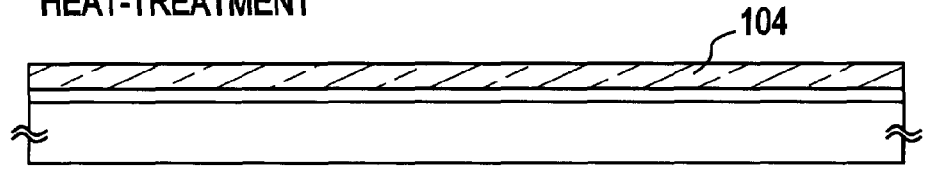
Figure 1D:
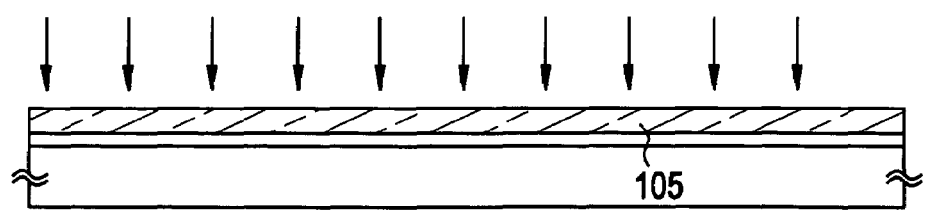

A method for forming a crystalline silicon film using this invention will be explained in conjunction with FIG. 1.

Base-material insulating film 101 is formed on substrate 100. As the base-material insulation film 101, a silicon nitride film, a silicon oxide film, a silicon oxynitride film or the like can be used. Incidentally, when using quartz for a substrate, the process to form the base-material insulating film 101 can be skipped.

Subsequently, amorphous silicon film 102 is formed as a semiconductor film on the base-material insulating film 101. Amorphous silicon film 102 is satisfactorily formed in the film thickness of 50 to 200 nm using well-known CVD method or sputtering method.

Subsequently, after hydrofluoric acid removes impurities and the natural oxide film adhering to the obtained amorphous silicon film surface so as to be clean, the surface is further processed with ozone water. Then a very thin (1 to 5 nm) oxide film is formed, and the acetic acid nickel solution which contains metallic elements used as a catalyst, for example, nickel, with a density of 5 ppm is applied on a silicon film to obtain catalyst element content layer 103. As metallic elements (also referred to as catalyst elements) used as catalysts, it is possible to apply any one sort or multiple sorts of elements of Fe, Co, Sn, Pb, Ru, Rh, Pd, Os, Ir, Pt, Cu, and Au in addition to nickel (Ni).

Also, as a doping method of the catalyst elements, sputtering method or vapor deposition method can be applied, in addition to coating of the solution containing catalyst element by using spin coating or the like.

Subsequently, it is preferable to perform heat-treatment of about 1 hour at 400 to 500° C., and to release hydrogen in a silicon film preceding the process of crystallization, to be subjected to heat-treatment thereafter at 550 to 700° C. in nitrogen atmosphere. In this embodiment, heat-treatment of 12 hours at 650° C. is set to obtain crystalline silicon film 104.

Incidentally, crystallizability can be further raised by irradiating laser beams to the crystalline silicon film obtained by the above process. Excimer laser with a wavelength of 400 nm or less or a second harmonic wave and a third harmonic wave of YAG laser are preferable for the laser beams. Anyway, the laser beams are condensed to 100 to 400 mj/cm$^2$ in an optical system using pulse laser with a repetition frequency of about 10 to 1000 Hz. And irradiation of this laser beam onto a crystalline silicon film at an overlap ratio of 90 to 95% is satisfactory.

Then, the element chosen from silicon, argon, germanium, helium, neon, krypton, and xenon is doped (implanted) over the obtained crystalline silicon film 104. The well-known ion doping method, ion implantation, or the reverse sputtering method is satisfactory as a doping method, so as to be contained in a crystalline silicon film with a concentration of $1\times10^{16}$–$5\times10^{18}$/cm$^3$.

Embodiment 2

An example of the manufacture method for a crystalline silicon film, which is different from the embodiment 1, will be explained referring to FIG. 2.

Base-material insulating film 201 is formed on substrate 200. Either of a silicon nitride film, a silicon oxide film, and a silicon oxynitride film, or laminated films thereof may be applied as base-material insulating films. Incidentally, when using quartz for a substrate, the process of forming the base-material insulating film 201 can be skipped.

Figure 2A:
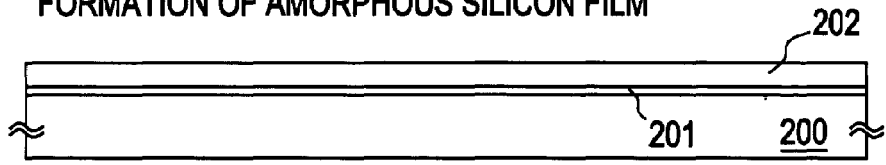
FIGS. 2A to 2D are views showing an example of a crystallization method using this invention. (Embodiment 2)

Amorphous silicon film 202 is formed by reduced-pressure CVD method on the base-material insulating film 201. (FIG. 2A). The well known methods such as sputtering method or CVD method is used to form in the film thickness of 50 to 200 nm.

Figure 2B:
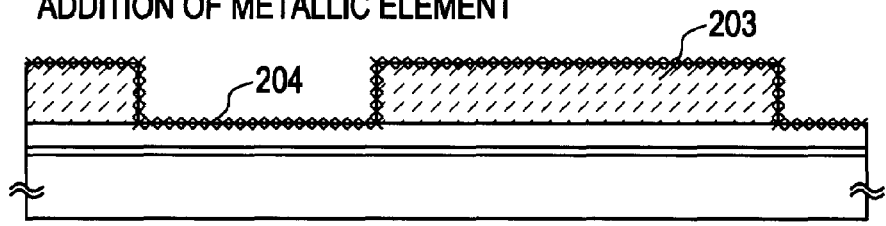

Next, the surface of the amorphous silicon film 202 is subjected to hydrofluoric acid processing so as to be clean, and silicon oxide is formed by CVD method on the clean silicon film 202. Then an aperture part is formed by etching to obtain a mask insulating film 203. (FIG. 2B).

Hydrofluoric acid removes impurities and the natural oxide film adhering to the surface of the silicon film exposed from the aperture of the mask insulating film 203. After that, processing with ozone water is carried out to form an oxide film with film thickness of about 1 to 5 nm. And the acetic acid nickel solution containing nickel with a concentration of 100 ppm is applied, catalyst elements are doped on a silicon film, to obtain layer containing catalyst element 204. As metallic elements (also referred to as catalyst elements) used as a catalyst, any one sort or multiple sorts of Fe, Co, Sn, Pb, Ru, Rh, Pd, Os, Ir, Pt, Cu, and Au may be applied in addition to nickel.

Also, sputtering method or vapor deposition method is satisfactory as a doping method, in addition to coating of solution containing the catalyst element by using spin coat or the like.

Figure 2C:
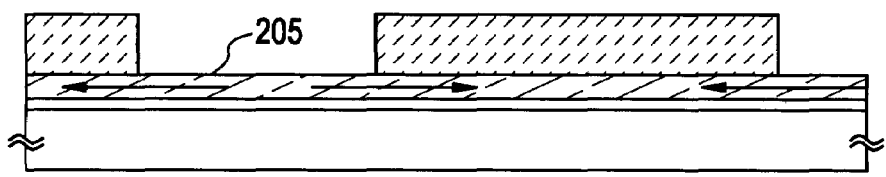
Figure 2D:
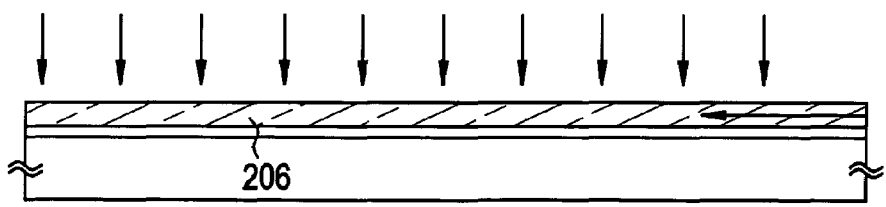

Subsequently, it is preferable to perform heat-treatment of about 1 hour at 400 to 500° C., and to release hydrogen in a silicon film preceding the process of crystallization. After that, the heat-treatment is performed at 550 to 600° C. in nitrogen atmosphere (in this embodiment, at 570° C. for 12 hours). Whereby, a CGS core generates in a region where catalyst elements are doped, and crystal growth is carried out as an arrow shown in FIG. 2C and crystalline silicon film 205 is formed. (FIG. 2C)

In addition, crystallizability can be further raised by irradiating laser beams onto the crystalline silicon film 205 obtained by the above process. Excimer laser with wavelength of 400 nm or less or a second harmonic wave or a third harmonic wave of YAG laser is satisfactorily used for the laser beams. Anyway, the laser beams are condensed to 100 to 400 mJ/cm$^2$ in an optical system by use of a pulse laser with a repetition frequency of about 10 to 1000 Hz, so as to be irradiated onto a crystalline silicon film at an overlap ratio of 90 to 95%.

Subsequently, the element chosen from silicon, argon, germanium, helium, neon, krypton, and xenon is doped (implanted) over the obtained crystalline silicon film 205. The well-known ion doping method, ion implantation method, or the reverse sputtering method is satisfactory as doping methods, so as to be contained in a crystalline silicon film with a concentration of $1\times10^{16}$ to $5\times10^{18}$/cm$^3$.

Thus, the obtained crystalline silicon film is in a state that a carrier included in the silicon film by irradiation of a light is hard to flow by defects effectively formed in the silicon film. Thus generating of light leakage current can be suppressed.

Embodiment 3

In this embodiment, TFT which forms a defect by doping argon over a semiconductor layer, and TFT which forms no defects are compared.

The concentration of the argon doped on the semiconductor film (implanted) is (1) 0/cm$^3$ (no argon addition) (2) $3.0\times10^{17}$/cm$^3$ (3) $5.0\times10^{17}$/cm$^3$ (4) $2.5\times10^{18}$/cm$^3$ (5) $6.6\times10^{18}$/cm$^3$ (6) $1.4\times10^{19}$/cm$^3$ (7) $3.0\times10^{19}$/cm$^3$. As for each TFT from (1) to (7), the measurement result of a field effect mobility, a threshold value, and OFF current and ON current are shown in FIGS. 3 and 4. Incidentally, the size of a semiconductor layer is channel length L/channel width W=8/8 μm.

Figure 3A:
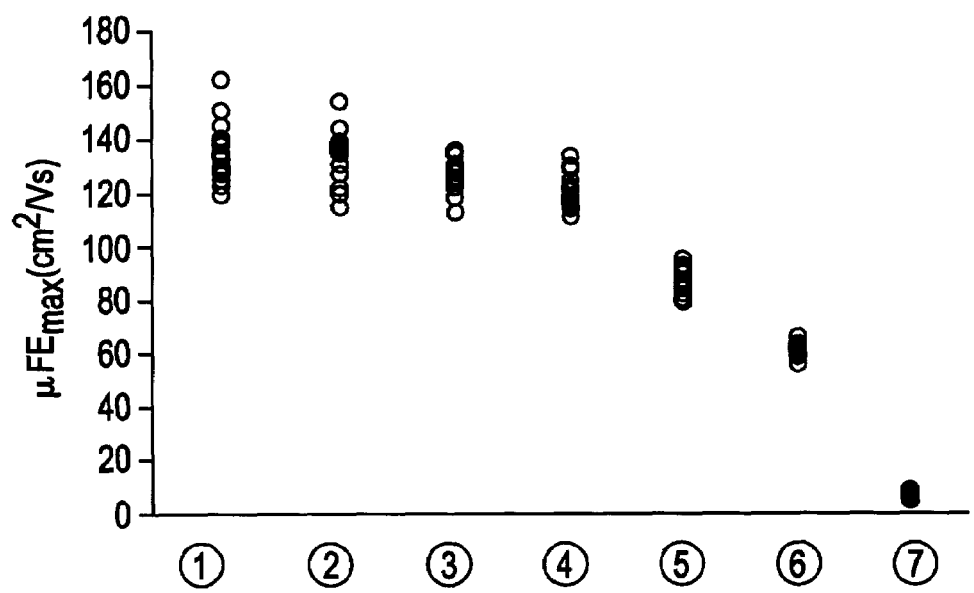
FIGS. 3A and 3B are views showing a measurement result of the electrical property of TFT. (1)

First, the field effect mobility value of TFT with argon concentration of (1) to (7) is shown in FIG. 3A. The value of TFT with Argon doping concentration of (2) to (4) is not inferior to TFT of (1) with no argon doped.

Figure 3B:
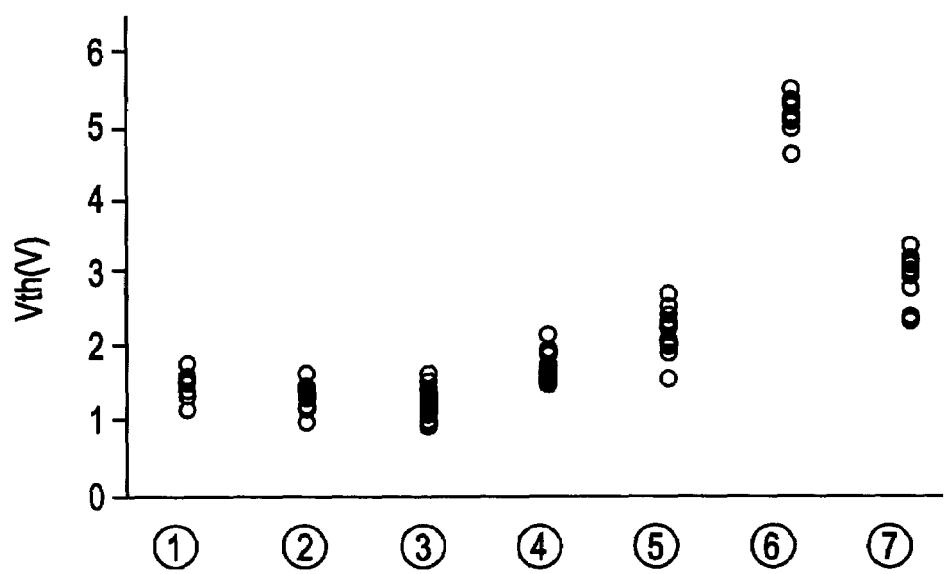

Subsequently, the threshold value of TFT with argon concentration of (1) to (7) is shown in FIG. 3B. TFT with argon doping concentration of (2) to (4) is not inferior to TFT of (1) with no argon doped. Unevenness is conspicuous as the concentration of argon becomes high.

Figure 4A:
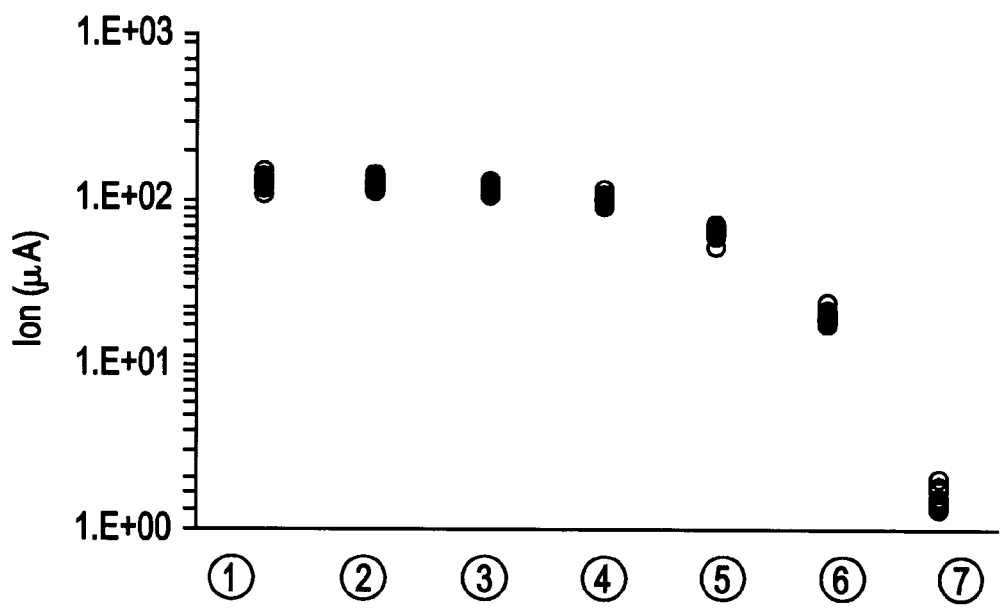
FIGS. 4A and 4B are views showing a measurement result of the electrical property of TFT. (2)
Figure 4B:
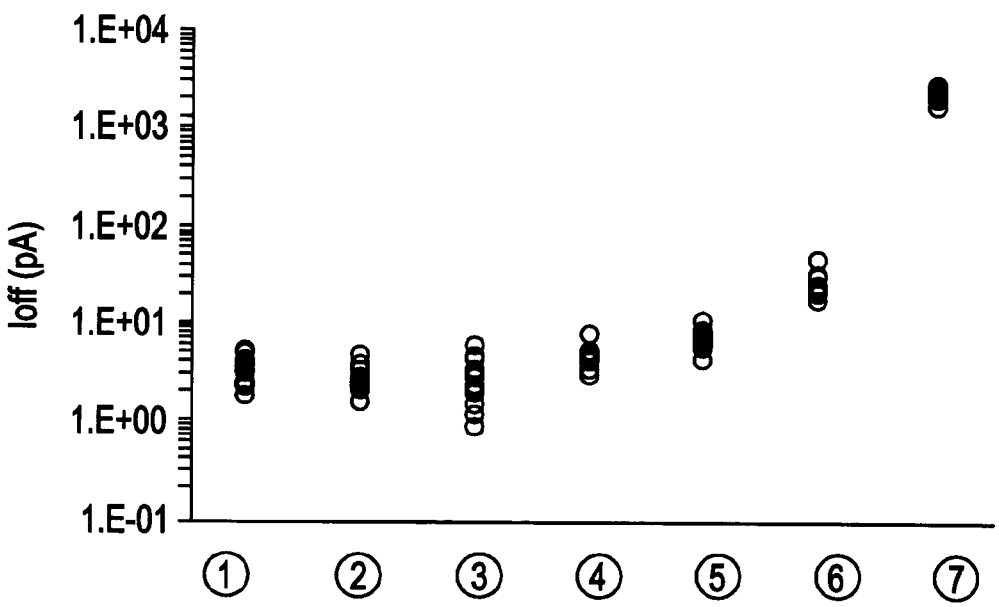

ON current and OFF current of TFT with Argon concentration of (1) to (7) is shown in FIGS. 4A and 4B respectively. As for TFT with argon doping concentration of (2) to (4), ON current and OFF current, which is not inferior to TFT of (1) with no argon doped is obtained. OFF current is likely to go up when the argon concentration in a semiconductor film goes up. ON current is likely to be low when the argon concentration in a semiconductor film goes up.

As described above, it is elucidated that in order to reduce light leakage current, the quality of a silicon film is not worsened and the characteristic of TFT is not reduced even when argon is doped over a crystalline silicon film with a concentration of $1\times10^{15}$ to $5\times10^{17}$/cm$^3$ (implanted) so that the defect may be formed. And according to this invention, in order to reduce light leakage current, the defect can be formed effectively.

Embodiment 4

Figure 5A:
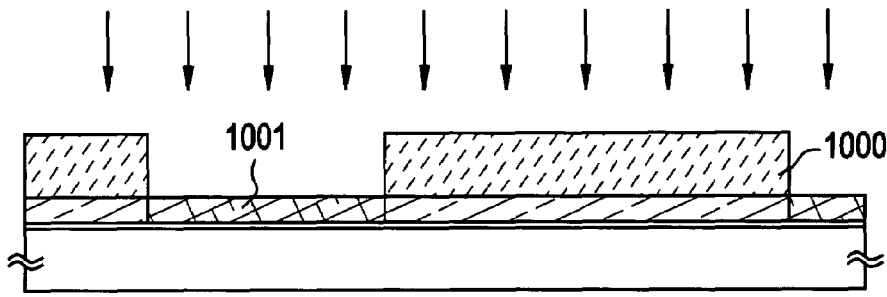
FIGS. 5A and 5B are views showing an example of the embodiment. (Embodiment 4)
Figure 5B:
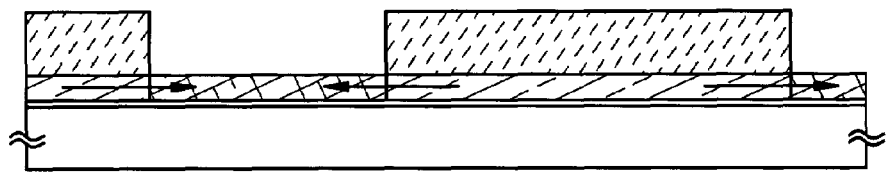

The crystalline silicon film produced using the crystallization method of the embodiments 1 to 3 contains catalyst elements with a concentration of $1\times10^{19}$/cm$^3$ in the film. Since problems, such as a sudden rise of OFF current, arise if the semiconductor element represented by TFT is formed with the catalyst elements included therein, it is preferable to reduce the concentration of the catalyst elements contained in a silicon film. Then, an example of a method which reduces the concentration of the catalyst elements is explained with reference to FIG. 5.

Mask insulating film 1001 having an aperture part is formed on a crystalline silicon film produced using either method of the embodiments 1 to 3.

Subsequently, the element (the element belonging to 15 group of a periodic table, such as phosphorous typically or the element belonging to 18 group of the periodic table, such as argon typically) which has a gettering action is doped in the crystalline silicon film exposed from the aperture part, and the gettering region (a region where catalyst elements moves) 1002 is formed.

For example, by performing heat-treatment of 4 to 24 hours at 450–800° C. using a furnace, catalyst elements move by gettering action of the element doped on the gettering region, to be captured therein. By the above, the concentration of the catalyst element contained in a region serving as an element region later (a channel formation region or a channel formation region and a source region, or junction region with a drain region) can be reduced. According to this gettering process, a silicon film with good crystallizability can be obtained.

This embodiment can be applied to the crystalline silicon film obtained using the method of the embodiments 1 and 2.

Embodiment 5

Figure 6A:
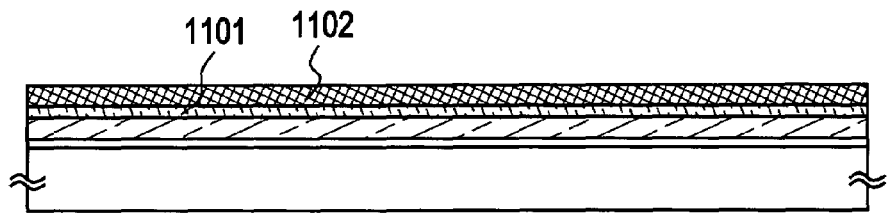
FIGS. 6A and 6B are views showing an example of the embodiment. (Embodiment 5)
Figure 6B:

An example of a method for reducing the concentration of catalyst elements, which is different from the embodiment 4, will be explained referring to FIG. 6.

Barrier layer 1101 is formed on the crystalline silicon film produced using either method of the embodiments 1 to 3. Since this barrier layer is a layer provided so as to protect a crystalline silicon film from etchant (not to be etched) in a process of removing a gettering region after the gettering process, this is referred to as a barrier.

Thickness of the barrier layer 1101 is set to about 1 to 10 nm. The barrier layer may simply be formed of chemical oxide produced by processing with ozone water. Moreover, the chemical oxide may also be formed similarly by processing in the mixed solution of such as sulfuric acid, chloride, nitric acid, and hydrogen peroxide water. As other methods, plasma processing in oxidization atmosphere, or oxidization processing by ultraviolet-rays irradiation in oxygen-containing atmosphere to cause ozone to be generated, is satisfactory. Moreover, using-clean oven, heat is applied at about 200 to 350° C., to form a thin oxide film, and this may serve as a barrier layer also. Or an oxide film may be deposited in about 1 to 5 nm by plasma CVD method, sputtering method, or vapor-deposition method to serve as a barrier layer. Anyway, the film where a catalyst element can move to a gettering site at the time of a gettering process and etching liquid does not sink in at the time of the removal process of the gettering site (a crystalline silicon film is protected from etching liquid) may be used. For example chemical oxide film formed by ozone water processing, silicon oxide film (SiOx), or porous film may be used.

Subsequently, on the barrier layer 1101 a second semiconductor film (typically amorphous silicon film) 1102 containing a rare gas element with a concentration of $1\times10^{20}$/cm$^3$ or more is formed in the thickness of 25 to 250 nm in a film as a gettering site by sputtering method. As for the gettering site 1102 to be removed later, it is preferable to form a film with low density in order to enlarge the etching selection ratio of the crystalline silicon film and the film of the gettering site.

Incidentally, when gettering site 1102 is formed setting gas (Ar) flux as 50 (sccm), setting formation power as 3 Kw, substrate temperature as 150° C., and formation pressure as 0.2–1.0 Pa, a semiconductor film containing the rare gas elements with a concentration of $1\times10^{19}/cm^3$–$1\times10^{22}/cm^3$, preferably $1\times10^{20}/cm^3$–$1\times10^{21}/cm^3$, and more preferably $5\times10^{20}/cm^3$, and capable of exerting a gettering effect is formed by sputtering method.

Incidentally, since a rare gas element is inactive in itself in a semiconductor film, it does not have a bad influence on crystalline semiconductor film 105. Also, one kind or plurality kinds of rare gas elements chosen from helium (He), neon (Ne) argon (Ar), krypton (Kr), and xenon (Xe) are used. In this invention, the rare gas elements are used as ion source in order to form a gettering site, and a semiconductor film containing these elements is formed to be defined as a gettering site.

In order to obtain a reliable gettering, heat-treatment is required after that. The heat-treatment is performed by furnace annealing method or RTA method. When the furnace annealing method is employed, heat-treatment of 0.5 to 12 hours at 450 to 600° C. in nitrogen atmosphere is performed. Also, when RTA method is employed, a lamp light source for heating is turned on for 1 to 60 seconds, preferably for 30 to 60 seconds, and it is repeated 1 to 10 times, preferably 2 to 6 times. Luminescence intensity of the lamp light source may be set on arbitrary bases. Also, it is set so that the semiconductor film may be heated at 600 to 1000° C. momentarily, and heated at as far as about 700 to 750° C. preferably.

Gettering process is advanced in such a way that the catalyst elements which exist in a region to be gettered (capture site) are released by thermal energy, and move to a gettering site by diffusion. Accordingly, gettering is dependant on processing temperature, and advances for a shorter time as temperature becomes higher. In this invention, distance of the move of the catalyst elements when gettering is performed is substantially the same as thickness of a semiconductor film as shown by the arrow in FIG. 9d. This shows that the gettering can be completed comparatively in a short time.

After the gettering process, gettering region 1102 is subjected to etching selectively and removed. As etching methods, dry etching without using plasma by $CIF_3$, or wet etching by alkali solution containing hydrazine, and tetraethyl ammonium hydroxide (chemical formula $(CH_3)_4NOH$) can be adopted. At this time, barrier layer 1101 functions as an etching stopper. Also, the barrier layer 1101 may be removed thereafter by hydrofluoric acid.

In this way, a crystalline silicon film with a concentration of catalyst elements reduced to $1\times10^{17}/cm^3$ or less can be obtained. This embodiment can be adopted to the crystalline silicon film obtained using the embodiments 1 and 2.

Embodiment 6

In this embodiment, an active-matrix substrate using the method of crystallization shown in the embodiments 1 to 4 will be explained referring to FIGS. 7 to 10. In addition, in this specification, the active-matrix substrate refers to a substrate including a drive circuit having a n channel type TFT and p channel type TFT, and including a pixel part having a pixel TFT and retention capacity on the same substrate.

A quartz substrate, a glass substrate, a ceramic substrate, and the like can be used for substrate 500. Also, a substrate having an insulating film formed on the surface of a silicon substrate, a metal substrate, or a stainless steel substrate may be adopted. Incidentally, when using a glass substrate, heat-treatment at the temperature lower than the glass distortion point by 10 to 20° C. may be performed before hand.

On substrate 500, a poly silicon film and a WSi film are formed, and patterning is applied on these films, to produce a lower light shielding film 501. As lower light shielding film 501, the film consisting of conductive materials, such as a poly silicon film, a $WSi_x$ (X=2.0–2.8) film, Al, Ta, W, Cr, and Mo, and its lamination structure can be used. In this embodiment, lower light shielding film 501 is formed at predetermined intervals by conductive materials with lamination structure of $WSi_x$ (film thickness: 100 nm) film 501b and poly silicon film (film thickness: 50 nm) 501a of high shielding property. In addition, since the lower light shielding film 501 has the function as a gate line, the portion corresponding to the lower light shielding film is referred to as a gate line hereafter.

First insulating film 502 is formed so that the gate line 501 may be covered. The first insulating film 502 is formed in thickness of about 100 nm. The insulating film containing silicon formed by plasma CVD method or sputtering method is used for this first insulating film 502. Also, in order to form the first insulating film 502, films may be a silicon oxide film, a silicon oxynitride film, a silicon nitride film, or laminated films thereof.

Subsequently, an amorphous semiconductor film is formed by a reduced-pressure CVD method on the first insulating film 502. Materials of the amorphous semiconductor film are not specified, and a silicon film is used in this embodiment. Semiconductor film (an amorphous semiconductor film, typically amorphous silicon film) 503 is formed by well-known methods, such as CVD method or plasma CVD method, with the thickness of 20 to 150 nm (preferably 30 to 80 nm).

Incidentally, since film formation method of base-material insulating film 502 and amorphous silicon film 503 can be the same, both films may be formed continuously. After forming the base-material insulating film 502, it becomes possible to prevent contamination of the surface by not exposing to air atmosphere once. Then, variation of characteristics of TFT or fluctuation of the threshold voltage when producing, can be reduced (FIG. 7A).

Subsequently, amorphous silicon film 503 is crystallized to produce crystalline silicon film 505. First, after hydrofluoric acid removes impurities and the natural oxide film adhering to the surface of amorphous silicon film 503 to be clean, the surface is further processed with ozone water. After forming a very thin (1 to 5 nm) oxide film, the acetic acid nickel solution containing metallic elements used as a catalyst for a silicon film, for example, nickel, with a concentration of 5 ppm is applied. Incidentally, adding method of catalyst elements can be performed by using sputtering method, vapor-deposition method, besides the aforementioned spin coat process (FIG. 7B).

Subsequently, it is preferable to perform heat-treatment of about 1 hour at 400 to 500° C., so that hydrogen in a silicon film may be released preceding the process of crystallization. Then, a crystal core appears in the region where the catalyst elements were doped by being subjected to heat-treatment at 550 to 600° C. for 12 hours, at 570° C. in this embodiment, in nitrogen atmosphere. Then crystal growth is carried out to produce a crystalline silicon film.

In addition, by use of a laser irradiation on the crystalline silicon film after the crystallization process, the crystallizability of the crystalline silicon film may satisfactorily be improved.

Subsequently, barrier layer 506 is formed on the crystalline silicon film 505. In this embodiment, the silicon oxide film is formed by setting formation temperature at 400° C., setting gas flux $SiH_4$ $N_2O$ as 4/800 sccm, setting pressure as $0.399 \times 10^2$ Pa, and setting Rf power density as 10/600 W/cm².

Then, second semiconductor film 507 used as a gettering region is formed on barrier layer 506. A silicon film is satisfactory for the second semiconductor film 507. Moreover, a rare gas element or carbon is doped over the second semiconductor film 507 with a concentration of $1 \times 10^{19}$ to $2 \times 10^{22}$/cm³ so that gettering may fully be performed. In addition, as an example of the formation method of the semiconductor film containing rare gas elements, formation of gettering region 507 consisting of the amorphous silicon film, by use of a target consisting of silicon in the atmosphere containing rare gas elements may be satisfactory. Moreover, one kind of or plurality kinds of rare gas elements chosen from helium (He), neon (Ne), argon (Ar), krypton (Kr), and xenon (Xe) are used. And argon (Ar) which is cheap gas is especially preferable.

Also, when a gettering region is formed using a target including phosphorous which is an electric conductivity type impurity element, the gettering can also be performed using coulomb's power of phosphorous in addition to the gettering by the rare gas elements.

Furthermore, second semiconductor film (gettering region) 507 is removed by etching after a gettering process. Therefore, the second semiconductor film comprises an amorphous semiconductor film as a film having a large etching selection ratio between itself and the first semiconductor film (crystalline silicon film) 505 to remove easily.

By performing heat-treatment, the catalyst element (nickel) remaining in the crystalline silicon film 505 is moved to the gettering region 507, and the gettering to reduce or remove the concentration is performed. As the heat-treatment using the gettering, processing to irradiate strong light or heat-treatment can be mentioned. And such a gettering is sufficiently performed so that the nickel contained in the crystalline silicon film 505 may hardly exist, namely, the nickel concentration in a film may be $1 \times 10^{18}$/cm³ or less, preferably $1 \times 10^{17}$/cm³ or less (FIG. 7C).

Subsequently, after the gettering region 507 only is subjected to etching and removed selectively, by using barrier layer 506 as an etching stopper, the barrier layer 506 is removed using hydrofluoric acid or the like.

Thus, when a crystalline silicon film is obtained, oxidization processing is performed for the purpose of raising the crystallizability of the crystalline silicon film 505 further. The silicon oxide film of 20 nm thickness is formed with reduced-pressure CVD equipment (not shown). Then heat-treatment at 950° C. is performed to produce a heat oxide film at a ratio of silicon oxide film/a portion where the silicon oxide film is oxidized=20:60 nm.

After the heat oxide film is subjected to etching, patterning of the crystalline silicon film 505 which became 35 nm thickness by heat oxidization processing is carried out, to produce semiconductor layers 508–511 in the form as shown in FIG. 7D.

Subsequently, semiconductor films 508 to 511 are covered and the silicon oxide film of 30 nm thickness is formed as second insulating film (gate insulating film) 512a.

Subsequently, the element chosen from silicon, argon, germanium, helium, neon, krypton, and xenon is doped (implanted) over the crystalline silicon film. The well-known ion doping method, ion implantation, or the reverse sputtering method is satisfactory as a doping method, so as to be contained in a crystalline silicon film with a concentration of $1 \times 10^{16}$ to $5 \times 10^{18}$/cm³. In this embodiment, formation of defects is made by doping (implantation) the element chosen from silicon, argon, germanium, helium, neon, krypton, and xenon after heat oxide treatment. However, defects-forming process is not limited to this example, but may be performed after crystallization process by catalyst elements, or after gettering process.

Subsequently, in order to use semiconductor layer 511 of the region which serves as retention capacity 604 later as a lower electrode of the retention capacity, mask 513 consisting of a resist is formed. The resist is provided for etching selectively a gate insulating film of the region right above the semiconductor film 511. Whereby the gate insulating film is removed and phosphorous is doped (FIG. 8A).

Then, mask 513 consisting of the resist is removed and the silicon oxide film of 50 nm thickness is formed as gate insulating film 512b of the second layer (FIG. 8B).

After forming the semiconductor films 508 to 511, in order to control the threshold value of TFT, a very small quantity of impurity elements (boronic acid or phosphorous) may be doped. This impurity doping process is arranged either before the crystallization process of a semiconductor film or after the crystallization process of a semiconductor film, or after the process of forming gate insulating film 512a.

Then, first insulating film 502 and gate insulating film 512 are subjected to selective etching, and a contact hole is formed so as to reach gate line 501. Subsequently, conductive film is formed on the gate insulation film 512. And gate electrodes 514 to 516 and capacity wiring (upper part electrode of retention capacity) 517 are formed on a channel formation region of each pixel by patterning. Gate insulating film 512 of the region where retention wiring 517 is formed consists of only gate insulating film of a second layer. This enables a thinner region than others, to thereby achieve an increase in retention capacity. Moreover, the gate electrode 516 is electrically connected with the gate line 501 through a contact hole. (FIG. 8C).

An electric conductive film for forming a gate electrode and capacity wiring is formed with about 300 nm thickness according to a conductive material and its lamination structures, such as poly silicon film having impurity elements, serving as elements imparting conductive type, doped thereon, and $WSi_x$ film (x=2.0 to 2.8), Al, Ta, W, Cr, and Mo. The single layer of the aforementioned conductive material is sufficient.

Subsequently, the impurity elements (hereinafter n type impurity elements or p type impurity elements), serving as elements imparting n type or p type selectively are doped over a semiconductor layer in order to form TFT including semiconductor layers 508 to 511 as active layers, and a source region and a drain region, and also LDD region of low resistance are formed. The impurity elements are doped on this LDD region similarly to the source region and the drain region.

In this way, a channel formation region inserted into a source region and a drain region is formed in the semiconductor layers 508 to 511 (FIG. 9A)

Subsequently, a third insulating film (first interlayer insulating film) 518 covering the gate electrodes 514 to 516 and the capacity wiring 517 is formed. Silicon oxide film, silicon nitride film, and silicon oxynitride film, or laminated films thereof formed in about 70 nm may be satisfactory as this third insulating film 518. (FIG. 9B).

Subsequently, fourth insulating film (second interlayer insulating film) 519 is formed. The fourth insulating film is formed of either one of an organic insulator material film, an silicon oxide film, a silicon nitride film or a silicon oxynitride film in thickness of 800 nm.

Subsequently, a contact hole leading to semiconductor layers 508 to 510 is formed in gate insulating film 512, third insulating film 518, and fourth insulating film 519. And a connection wiring for connecting each TFT electrically and source lines 520 to 525 are formed on fourth insulating film 519 by patterning conductive films reaching semiconductor films 508 to 511 through the contact hole. Conductive films to form these wiring are formed in such a way that conductive films consisting of Al, W, Ti, TiN as main compositions or conductive films having lamination structure of these films (formed in three-layer structure sandwiching Al film containing Ti by Ti in this embodiment) are formed in the thickness of 500 nm, and patterning is applied thereon. Incidentally, the source line 525 passes along the upper part of the retention capacity, and electrically connected to the semiconductor layer 510 (FIG. 9C).

Subsequently, fifth insulating film 526 which covers connection wiring is formed in 1000 nm thickness from organic insulating films, such as acrylics. (FIG. 10A). Light shielding film 527 is formed on the fifth insulating film 526 by patterning Al, Ti, W, Cr or films having high shielding property such as a black resin. This light shielding film 527 is made into a network structure so that the part other than the aperture part of a pixel may be shield. Further, sixth insulating film 528 consisting of the same material as the fifth insulating film 526 is formed so that this light shielding film 527 may be covered. The contact hole leading to connection wiring 524 is formed in the fifth insulating film 526 and the sixth insulating film 528.

Subsequently, transparent conductive films, such as ITO, are formed in 100 nm thickness and pixel electrode 529 is formed by patterning (FIG. 10B).

Figure 11:
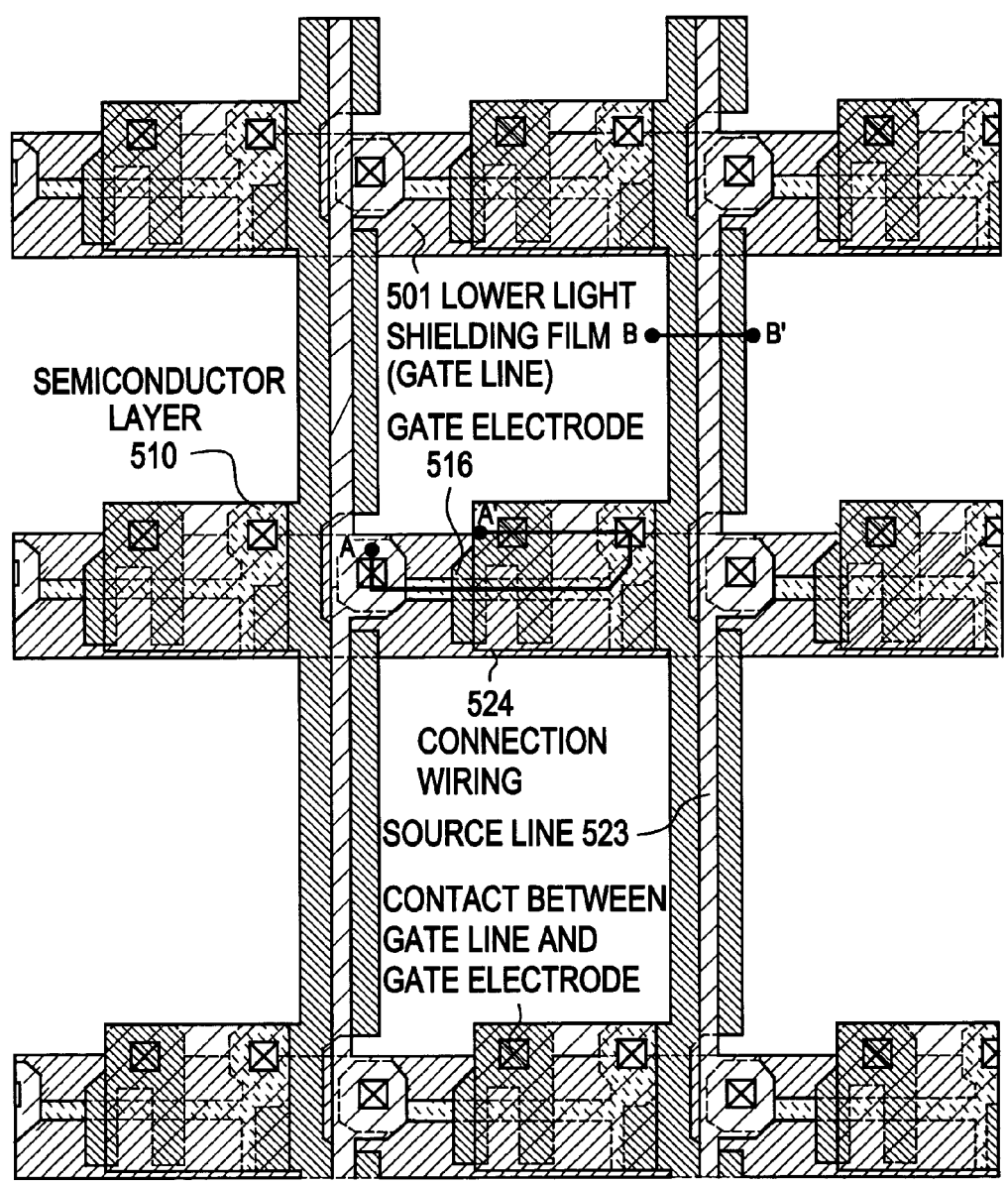
FIG. 11 is a top view of the display device manufactured using this invention.

FIG. 11 is a top view showing the state formed so far, and substantial cross-sectional view taken along the line A–A' corresponds to the line A–A' of FIG. 10B, and substantial cross-sectional view taken along the line B–B' corresponds to the line B–B' of FIG. 10B.

An alignment layer for aligning a liquid crystal layer is formed on thus formed active matrix substrate. After pasting a counter substrate having a counter electrode and an alignment layer formed thereon, and an active-matrix substrate together, using the well-known cell assembly technology, the active matrix liquid crystal display device was completed by injecting and sealing liquid crystal.

Embodiment 7

An active matrix type liquid crystal display device produced in the embodiment 6 will be explained in this embodiment.

Figure 12:
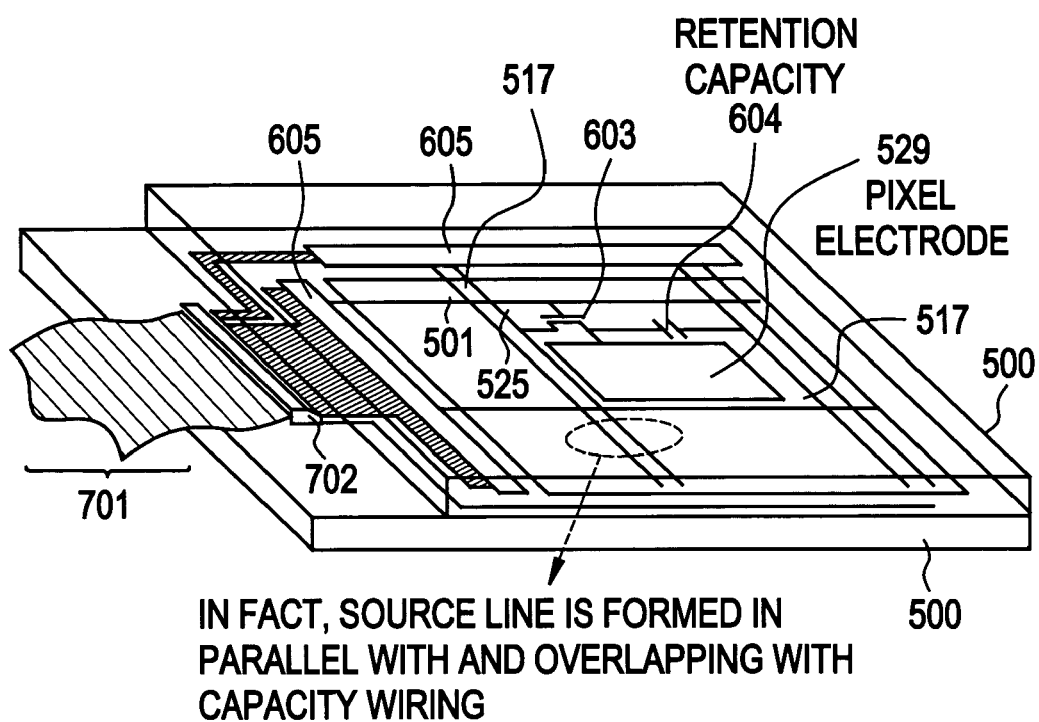
FIG. 12 is a block diagram showing the constitution of an active-matrix type crystal display device manufactured using this invention.

In FIG. 12, an active-matrix substrate consists of a pixel part and drive circuit 605 formed on-substrate 500, and other signal-processing circuits. Pixel TFT 603 and retention capacity 604 are formed in the pixel part. The drive circuit prepared around the pixel part is constituted on the basis of the CMOS circuit.

Capacity wiring 517 is formed in the direction parallel to source line 523, and functions as an upper electrode of the retention capacity 604.

From drive circuit 605, gate line 501 and source line 523 are extended in the pixel part respectively, and connected to pixel TFT 603. Moreover, flexible printed circuit (FPC) 701 is connected to external input terminal 702, to be thereby used when inputting a picture signal and the like. FPC 701 is pasted up firmly with reinforcement resin, and connected to respective drive circuit by connection wiring. Moreover, counter substrate 700 includes a light shielding film or a transparent electrode which is not shown in figures.

This embodiment is producible using the active-matrix substrate formed using either method disclosed in the embodiments 1 to 3.

Embodiment 8

In this embodiment, a defect is formed only in a pixel part and an embodiment of this invention made into a pixel part and a drive circuit will be explained.

The active-matrix type display device including a drive circuit and a pixel part on the same substrate can produce a drive circuit and a pixel part in the same process. This contributes to reduction of manufacture cost. Moreover, the area of a frame region (region of the circumference portion of the pixel part) can also be reduced. This leads to advantages, such as a miniaturization of a display device. However, on the other hand the characteristics and the conditions of operation demanded for TFT used in a drive circuit and a pixel part is not necessarily the same, involving problem of production process being complicated when trying to make the TFT into a structure including the demanded characteristics.

Hereupon, in this embodiment a method to reduce light leakage current is shown in the following manner: one kind or plurality kinds of elements chosen from silicon, argon, germanium, helium, neon, krypton, and xenon are not doped (implanted) on a semiconductor layer of the region serving as a drive circuit where a high-speed response and high-speed operation are demanded, forming no defects, and the elements described above are doped (implanted) on the region serving as a pixel part where characteristics such as low leakage current and low light leakage current for incoming signal retention is demanded, forming defects.

A resist mask is formed in the region where TFT which constitutes a drive circuit with the necessity for a high-speed response is formed. Subsequently, defects are formed effectively in a semiconductor film by doping one kind or plurality kinds of elements chosen from silicon, argon, germanium, helium, neon, krypton, and xenon with a concentration of $1 \times 10^{16}$–$5 \times 10^{18}$/cm$^3$.

With the arrangement described above, an active-matrix type display device can be achieved by including a drive circuit and a pixel part. The drive circuit is formed by using a silicon film with good crystallizability (such as better alignment and bigger grain size of crystalline) where metal elements are doped in order to write in data at high speed for example, when a vast quantity of data, such as performing a high definition display or performing an animation display, must be written in. The pixel part is formed to function in such a way that in order to maintain an incoming signal and to perform a good display, the leakage current at the time of OFF of TFT is reduced low, and light leakage current is suppressed so as to be hard to generate even when light carries out incidence onto the semiconductor layer.

This embodiment is adaptable in combination with the embodiments 1 to 7.

Embodiment 9

The CMOS circuit and pixel part formed according to this invention can be used for an active matrix liquid crystal display (liquid crystal display device). That is, this invention can be adapted to all the electrical appliances incorporating these liquid crystal displays in a display part.

A projector can be mentioned as such electrical appliances. An example of the projector is shown in FIGS. 13 and 14.

Figure 13A:
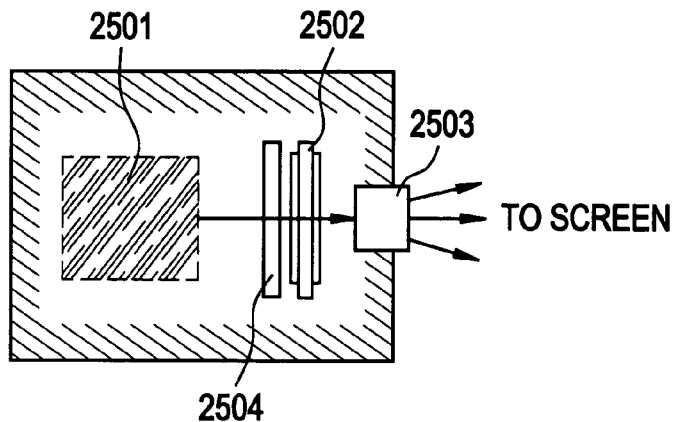
FIGS. 13A to 13C are views showing an example of electrical appliances using the display device obtained using this invention.

First, FIG. 13A is a view showing an example of a single board projector. The projector shown in FIG. 13A includes a light source optical system 2501, a liquid crystal display device 2502, a projecting optical system 2503, a phase difference plate 2504. The projecting optical system 2503 consists of pluralities of optical lenses equipped with projection lenses. Incidentally, the projecting optical system 2503 may consist of one projection lens. Moreover, a color filter is formed in liquid crystal display device 2502, which is not shown, in order to colorize a display.

Figure 13B:
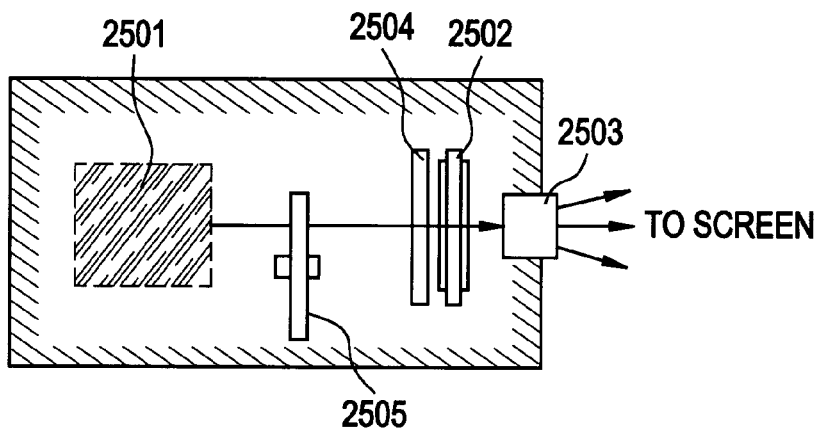

Also, a single board projector shown in FIG. 13B is an application example of FIG. 13A, showing an example of colorizing a display image using RGB rotation color filter disk 2505 instead of providing a color filter in a pixel.

Figure 13C:
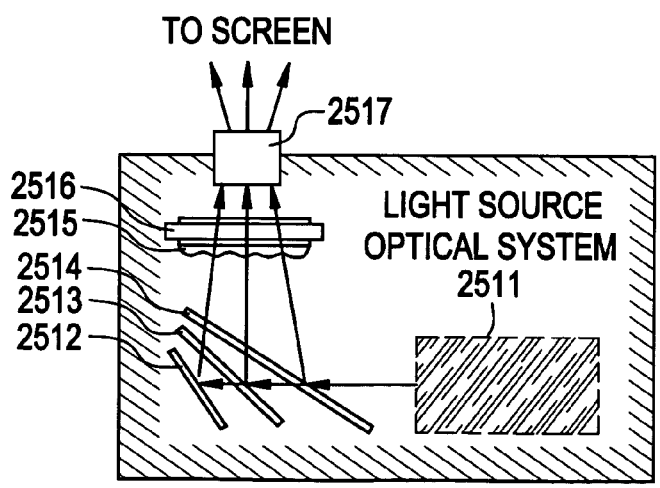

Moreover, the single board projector shown in FIG. 13C is referred to as the color filter-less single board projector, including microlens array 2515 in liquid crystal display device 2516. And dichroic mirror 2512 for B, dichroic mirror 2513 for G, and dichroic mirror 2514 for R are used to colorize a display image. Projecting optical system 2517 consists of pluralities of optical lenses equipped with projection lenses. Incidentally, one lens is satisfactory to constitute the projecting optical system.

Figure 14A:
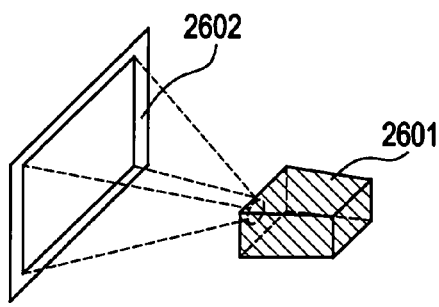
FIGS. 14A to 14D are views showing an example of electrical appliances including the display device obtained using this invention in a display part.

Subsequently, a front type projector is shown in FIG. 14A. The front type projector includes projection device 2601 and screen 2602.

Figure 14B:
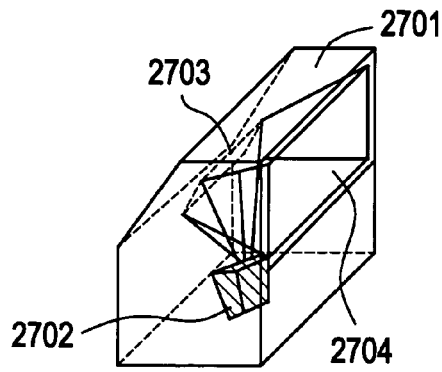

FIG. 14B is a view showing a rear type projector, including a main body 2701, projection device 2702, mirror 2703, and screen 2704.

Figure 14C:
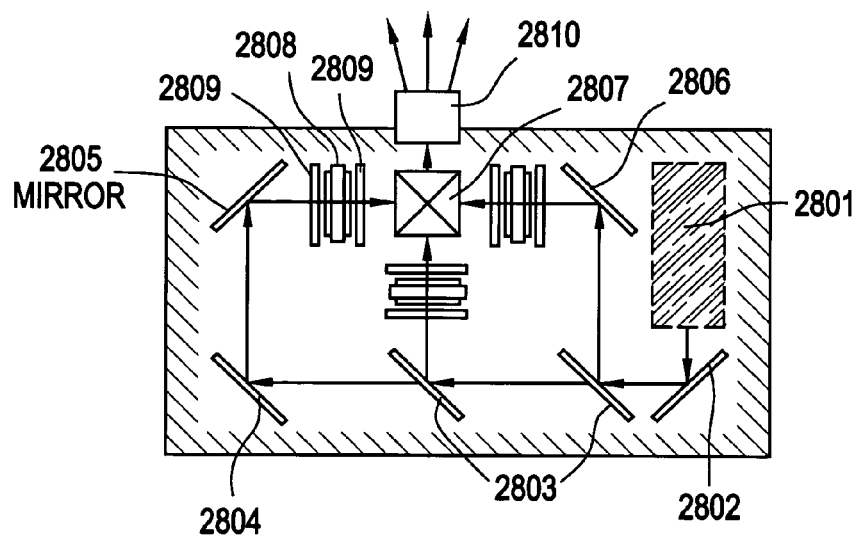

Incidentally, FIG. 14C is a view showing an example of the structure of projection devices 2601, 2702 of FIG. 14A and 14B. Projection devices 2601 and 2702 consist of light source optical system 2801, mirrors 2802, 2804 to 2806, dichroic mirror 2803, prism 2807, liquid crystal display device 2808, phase difference plate 2809, and projecting optical system 2810. The projecting optical system 2810 consists of optical system including projection lenses. Three plate type was shown as an example of this embodiment. However, it is not limited thereto, and single board may be satisfactory, for example. Also, optical system such as optical lenses, films having polarization function, films for adjusting phase difference, and IR film may be satisfactorily provided as needed.

Figure 14D:
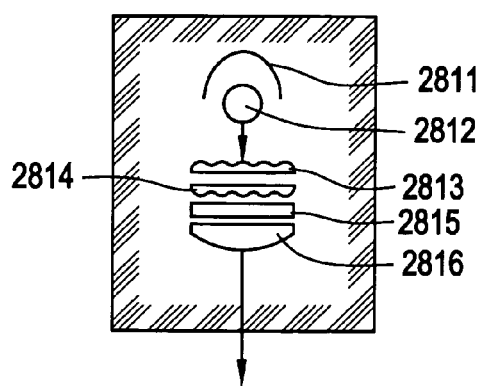

Also, FIG. 14D is a view showing an example of a structure of light source optical system 2801 in FIG. 14C. In this embodiment, the light source optical system 2801 consists of reflector 2811, light source 2812, lens array 2813 and 2814, polarization converting element 2815, and condenser lens 2816. Incidentally, the light source optical system shown in FIG. 14D is one example and is not limited thereto. For example, optical system such as optical lenses, films having polarization function, films for adjusting phase difference, and IR film may be satisfactorily provided as needed.

However, the projector shown in FIG. 14 indicates the case using a transmit type electric optical device, and an application example of using a reflective type liquid crystal display device is not shown.

As described above, a liquid crystal display device produced according to this invention is adaptable for a projector.

Optical sensitivity can be suppressed without spoiling the high degree of carrier movement of a crystalline semiconductor layer by doping (implanting) such as silicon, argon, germanium, helium, neon, krypton, xenon on the whole region of the crystalline semiconductor layer of a semiconductor device, and forming a crystal defect with suitable density.

When this TFT is applied to a pixel TFT of a transmit type display device, even when the optical incidence onto TFT is not prevented to some extent, good display with little optical leakage and with no contrast fall can be obtained, and also high frequency drive of the display is possible by high TFT performance.

Moreover, taking advantage of little optical leakage of the TFT itself, even a device with simpler TFT light shielding structure can also have display quality equivalent to the conventional device. Whereby reduction of manufacture cost can be achieved.

What is claimed is:

1. A semiconductor device comprising:
   a transparent substrate;
   a light shielding film provided over said transparent substrate;
   a crystalline semiconductor layer provided over said light shielding film; and
   crystal defects formed in the crystalline semiconductor layer,
   wherein one kind or plurality kinds of elements chosen from argon, germanium, silicon, helium, neon, krypton, and xenon are included in the crystalline semiconductor layer with a concentration of $1 \times 10^{16}$ to $5 \times 10^{18}/cm^3$.

2. A device according to claim 1 wherein the crystal defects due to the element implantation are distributed by uniform density throughout the whole region of the semiconductor layer.

3. A semiconductor device comprising:
   a transparent substrate;
   a light shielding film provided over said transparent substrate;
   a crystalline semiconductor layer comprising a channel region provided over said light shielding film, said semiconductor layer including metal elements with a concentration of $1 \times 10^{15}$–$5 \times 10^{17}/cm^3$, and at least said channel region including one kind or plurality kinds of elements chosen from silicon, argon, germanium, helium, neon, krypton, and xenon with a concentration of $1 \times 10^6$–$5 \times 10^{18}/cm^3$ and
   crystal defects formed in the crystalline semiconductor layer.

4. A device according to claim 3, wherein the metal elements are either of one kind of or plurality kinds of Ni, Fe, Co, Sn, Pb, Ru, Rh, Pd, Os, Ir, Pt, Cu, and Au.

5. A semiconductor device comprising:
   a transparent substrate;
   a light shielding film provided over said transparent substrate:
   a crystalline semiconductor layer provided over said light shielding film and including metal elements with a concentration of $1 \times 10^{15}$–$5 \times 10^{17}/cm^3$ in the semiconductor layer, and also including one kind or plurality kinds of elements chosen from silicon, argon, germanium, helium, neon, krypton, and xenon with a concentration of $1 \times 10^{16}$–$5 \times 10^{18}/cm^3$ the semiconductor layer.

6. A device according to claim 5, wherein the metal elements are either of one kind of or plurality kinds of Ni, Fe, Co, Sn, Pb, Ru, Rh, Pd, Os, Ir, Pt, Cu, and Au.

7. A semiconductor device comprising:
   a transparent substrate;
   a light shielding film provided over said transparent substrate;

a crystalline semiconductor layer comprising a channel region provided over said light shielding film;

a source region and a drain region sandwiching said channel region;

a gate electrode provided adjacent to said channel region with a gate insulating film therebetween; and crystal defects formed in the crystalline semiconductor layer, wherein one kind or plurality kinds of elements chosen from argon, germanium, silicon, helium, neon, krypton, and xenon are included in the crystalline semiconductor layer with a concentration of $1\times10^{16}$ to $5\times10^{18}/cm^3$.

8. A device according to claim 7 wherein the crystal defects due to the element implantation are distributed by uniform density throughout the whole region of the semiconductor layer.

9. A semiconductor device comprising:

a transparent substrate;

a light shielding film provided over said transparent substrate;

a crystalline semiconductor layer comprising a channel region provided over said light shielding film;

a source region and a drain region sandwiching said channel region;

a gate electrode provided adjacent to said channel region with a gate insulating film therebetween;

crystal defects formed in the crystalline semiconductor layer; and a light source, wherein one kind or plurality kinds of elements chosen from argon, germanium, silicon, helium, neon, krypton, and xenon are included in the crystalline semiconductor layer with a concentration of $1\times10^{16}$ to $5\times10^{18}/cm^3$.

10. A device according to claim 9 wherein the crystal defects due to the element implantation are distributed by uniform density throughout the whole region of the semiconductor layer.

11. A semiconductor device comprising:

a transparent substrate;

a light shielding film provided over said transparent substrate;

a crystalline semiconductor layer comprising a channel region provided over said light shielding film;

a source region and a drain region sandwiching said channel region;

a gate electrode provided adjacent to said channel region with a gate insulating film therebetween; and crystal defects formed in the crystalline semiconductor layer, wherein one kind or plurality kinds of elements chosen from argon, germanium, silicon, helium, neon, krypton, and xenon are included in the channel region of the crystalline semiconductor layer with a concentration of $1\times10^{16}$ to $5\times10^{18}/cm^3$.

12. A device according to claim 11 wherein the crystal defects due to the element implantation are distributed by uniform density throughout the whole region of the semiconductor layer.

* * * * *